(12) United States Patent
Velayutham

(10) Patent No.: US 11,736,043 B2
(45) Date of Patent: Aug. 22, 2023

(54) ENERGY HARVESTING SYSTEM AND METHOD OF MANUFACTURE

(71) Applicant: Katrick Technologies Limited, Glasgow (GB)

(72) Inventor: Karthikeyan Velayutham, Glasgow (GB)

(73) Assignee: Katrick Technologies Limited, Glasgow (GB)

( * ) Notice: Subject to any disclaimer, the term of this patent is extended or adjusted under 35 U.S.C. 154(b) by 0 days.

(21) Appl. No.: 17/296,905

(22) PCT Filed: Jul. 23, 2020

(86) PCT No.: PCT/GB2020/051765
§ 371 (c)(1),
(2) Date: May 25, 2021

(87) PCT Pub. No.: WO2021/019215
PCT Pub. Date: Feb. 4, 2021

(65) Prior Publication Data
US 2022/0029561 A1  Jan. 27, 2022

(30) Foreign Application Priority Data

Aug. 1, 2019 (GB) .................................... 1911017
May 7, 2020 (GB) .................................... 2006829

(51) Int. Cl.
*H02N 2/18* (2006.01)
*F03G 7/08* (2006.01)
(Continued)

(52) U.S. Cl.
CPC ............... *H02N 2/186* (2013.01); *F03G 7/08* (2013.01); *H02K 35/02* (2013.01); *H02N 2/181* (2013.01); *H10N 30/30* (2023.02)

(58) Field of Classification Search
CPC .......... H02N 2/186; H02N 2/181; F03G 7/08; H01L 41/113; H02K 35/02
See application file for complete search history.

(56) References Cited

U.S. PATENT DOCUMENTS 5,814,921 A   9/1998  Carroll
9,188,187 B2  11/2015 Jolley et al.
(Continued)

FOREIGN PATENT DOCUMENTS

CN   101860262 A   10/2010
CN   102237761 A   11/2011
(Continued)

*Primary Examiner* — Viet P Nguyen
(74) *Attorney, Agent, or Firm* — Holzer Patel Drennan

(57) ABSTRACT

A vibrational lens is disclosed. The vibrational lens comprises at least two focusing plates each having a proximal and distal end. The separation between the distal ends of the at least two focusing plates is less than the separation between the proximal ends of the at least two focusing plates. The vibrational lens transmits, converges and focuses vibrational energy from a source to an energy conversion means such as piezoelectric crystals. The vibrational lens may also comprise a bimetallic structure to convert thermal fluctuations into mechanical displacement. The vibrational lens is suitable for use in a vibrational and or thermal energy harvesting system. Advantageously, the vibrational lens improves the energy efficiency of, for example, an internal combustion engine whilst mitigating the need for vibrational damping mechanisms and or thermal insulation.

33 Claims, 16 Drawing Sheets

(51) Int. Cl.
*H02K 35/02* (2006.01)
*H10N 30/30* (2023.01)

(56) References Cited

U.S. PATENT DOCUMENTS

| | | | |
|---|---|---|---|
| 9,973,113 | B1 | 5/2018 | Lou et al. |
| 2007/0114890 | A1 | 5/2007 | Churchill et al. |
| 2007/0188053 | A1 | 8/2007 | Stark |
| 2007/0284969 | A1 | 12/2007 | Xu |
| 2008/0079333 | A1 | 4/2008 | Ulm et al. |
| 2008/0129147 | A1 | 6/2008 | Thiesen et al. |
| 2008/0204005 | A1 | 8/2008 | Wang |
| 2010/0219720 | A1 | 9/2010 | Namuduri et al. |
| 2010/0219721 | A1 | 9/2010 | Namuduri et al. |
| 2010/0244457 | A1 | 9/2010 | Bhat et al. |
| 2011/0057547 | A1 | 3/2011 | Fain |
| 2011/0304239 | A1 | 12/2011 | Eichhorn et al. |
| 2012/0169064 | A1 | 7/2012 | Hoffman et al. |
| 2012/0267982 | A1 | 10/2012 | Carman et al. |
| 2013/0207520 | A1 | 8/2013 | Near |
| 2013/0221802 | A1 | 8/2013 | Oh |
| 2013/0341936 | A1* | 12/2013 | Wood .................... H02N 2/188 290/1 R |
| 2013/0342075 | A1* | 12/2013 | Seddik ................ H01L 41/1136 310/323.01 |
| 2014/0077662 | A1 | 3/2014 | Lueke et al. |
| 2015/0061464 | A1* | 3/2015 | Park ....................... H02N 2/186 310/329 |
| 2015/0115769 | A1 | 4/2015 | Savelli et al. |
| 2016/0156287 | A1 | 6/2016 | Yang et al. |
| 2017/0117823 | A1 | 4/2017 | Arnaud et al. |
| 2017/0229630 | A1* | 8/2017 | Zhan ....................... H02N 1/08 |

FOREIGN PATENT DOCUMENTS

| | | |
|---|---|---|
| CN | 102710168 A | 10/2012 |
| CN | 102751909 A | 10/2012 |
| CN | 202652103 U | 1/2013 |
| CN | 103117677 A | 5/2013 |
| CN | 103166503 A | 6/2013 |
| CN | 103532428 A | 1/2014 |
| CN | 103532429 A | 1/2014 |
| CN | 204615694 U | 9/2015 |
| CN | 105226994 A | 1/2016 |
| CN | 105790404 A | 7/2016 |
| CN | 106411177 A | 2/2017 |
| CN | 107270424 A | 10/2017 |
| CN | 108964519 A | 12/2018 |
| CN | 109067245 A | 12/2018 |
| DE | 3048277 A1 | 7/1982 |
| EP | 2584683 A1 | 4/2013 |
| FR | 2582153 A1 | 11/1986 |
| GB | 2550115 A | 11/2017 |
| KR | 101222005 B1 | 1/2013 |
| KR | 20140001060 A | 1/2014 |
| KR | 20140106009 A | 9/2014 |
| KR | 20150088104 A | 7/2015 |
| KR | 101682962 B1 | 12/2016 |
| RO | 130912 A2 | 2/2016 |

* cited by examiner

Determine Characteristics of a Vibration Source — S1001

Determine Optimum Parameters (e.g. α, β and γ) for a Vibrational Lens for use with the Vibrational Source (S1001) — S1002

Provide the Vibrational Lens according to the Optimum Parameters (S1002) — S1003

*Fig. 8*

Determine Characteristics of a Cyclic Temperature Variation    S2001

Determine Optimum Parameters (x, y, z dimensions, material of layers) for a Bimetallic Strip for use with the Cyclic Temperature Variation (S2001)    S2002

Provide the Bimetallic Strip according to the Optimum Parameters (S2002)    S2003

*Fig. 14*

ENERGY HARVESTING SYSTEM AND METHOD OF MANUFACTURE

The present invention relates to an energy harvesting system and method of manufacture. In particular, the described energy harvesting system is suitable for harvesting energy from, an internal combustion engine of an automobile.

BACKGROUND TO THE INVENTION

An internal combustion engine, as typically found in an automobile, converts chemical energy into desired mechanical energy by combusting a fuel such that the expansion and increase in pressure of the resulting gases drives a piston. An internal combustion engine is not 100% efficient as energy is lost in the form of, primarily, thermal and vibrational energy. In fact, a conventional automobile typically uses just 10% to 16% of the chemical energy from the fuel to drive the automobile. In additional to the engine itself, there are energy losses in, for example, the transmission, the brakes and even the rolling resistance of the automobile. Nevertheless, the engine accounts for the largest energy loss within an automobile of typically 63%.

The above described internal combustion engines and automobiles have numerous disadvantages. For example, the operating inefficiencies result in a greater environmental impact due to the increased levels of fuel consumption. As the fuel is typically derived from a fossil fuel, which is a finite resource, the fossil fuels are depleted at an increased rate. Furthermore, an inefficient engine and automobile will have a greater cost per mile.

In addition, the wasted energy may have negative consequences on the operation of the internal combustion energy. For example, the excess vibrations may necessitate the installation of expensive, vibrational damping mechanisms to limit the damage to the engine and impact on the performance. Also, the excess thermal energy may require additional expensive and heavy thermal installation to stop the engine from overheating.

SUMMARY OF THE INVENTION

It is an object of an aspect of the present invention to provide an energy harvesting system that obviates or at least mitigates one or more of the aforesaid disadvantages of the energy harvesting systems known in the art.

According to a first aspect of the present invention there is provided a vibrational lens comprising at least two focusing members, each of the at least two focusing members having a proximal end for attachment to a vibrational source and a distal end, wherein the at least two focusing members are arranged such that the separation between the focusing members decreases from the proximal ends towards the distal ends.

Most preferably, the at least two focusing members each comprise a first portion located between the proximal end and distal end. The first portions of the at least two focusing members are angled relative to each other such that the at least two focusing members converge at the distal ends.

Preferably, the at least two focusing members each comprise a second portion located at the proximal end. Preferably, the second portions of the at least two focusing members are substantially parallel.

Most preferably, the vibrational lens further comprises a backplate. The proximal ends of the at least two focusing members may be fixed to the backplate. The second portions of the at least two focusing members may be fixed to the backplate.

Preferably, the at least two focusing members each comprise a third portion located at the distal end. The third portions of the at least two focusing members are substantially parallel. The third portions of the at least two focusing members define a focal point of the vibrational lens.

Preferably, the at least two focusing members comprise brass.

Optionally, the at least two focusing members comprise two or more layers and or coatings. The two or more layers and or coatings may exhibit different vibrational and or thermal characteristics. The at least two layers and or coatings may comprise different dimensions, materials, densities and or grain structures.

Optionally, the at least two focusing members comprise a first layer and a second layer. The first layer is fixed to the second layer. The first layer has a different coefficient of thermal expansion to the second layer. The first layer may comprise brass. The second layer may comprise steel.

Optionally, the vibrational lens further comprises one or more springs. The one or more springs connect the at least two focusing members.

Optionally, the vibrational lens further comprises one or more weights attached to one or more of the at least two focusing members.

Optionally, the vibrational lens further comprises a dynamic control system. The dynamic control system changes the vibrational characteristics of the vibrational lens during operation. The dynamic control system may adjust the stiffness of the spring. The dynamic control system may adjust the location and or magnitude of the weights.

Optionally, the vibrational lens may comprise three focusing members.

Most preferably, the focusing members are focusing plates.

Alternatively, the focusing members are focusing rods.

According to a second aspect of the present invention there is provided an energy harvesting system comprising a vibrational lens in accordance with the first aspect of the present invention, a vibrational source and an energy conversion means.

Most preferably, a proximal end of the vibrational lens is fixed to the vibrational source.

Preferably, the vibrational source is an internal combustion engine.

Most preferably, the energy conversion means is located at a distal end of the vibrational lens. Preferably, the energy conversion means is located between the third portions of the at least two focusing members.

Preferably, the energy conversion means is one or more piezoelectric crystals. Alternatively, the energy conversion means is one or more magnets and one or more coils.

Optionally, the energy harvesting system may further comprise one or more bimetallic strips.

Optionally, the energy harvesting system may further comprise and one or more vibration chambers.

Optionally, the vibration chamber comprises a first surface and a second surface.

Optionally, the vibration chamber is dimensioned relative to the distal end of the bimetallic strip such that the bimetallic strip can strike the first and second surfaces of the vibration chamber. The vibration chamber is dimension to be larger than the distal end of the bimetallic strip.

Embodiments of the second aspect of the invention may comprise features to implement the preferred or optional features of the first aspect of the invention or vice versa.

According to a third aspect of the present invention there is provided a method of manufacturing a vibrational lens comprising:

providing at least two focusing members, each having a proximal end for attachment to a vibrational source and a distal end; and arranging the at least two focusing members such that the separation between the at least two focusing members decreases from the proximal ends towards the distal ends.

Most preferably, the method further comprises determining the characteristics of the vibrational source.

Preferably, determining the characteristics of the vibrational source comprises quantifying any one of the following parameters: revolutions per minute, noise level, engine gas temperature, output power, torque and ambient temperature.

Most preferably, the method further comprises determining the optimum parameters of the vibrational lens for use with the vibrational source.

Preferably, determining the optimum parameters of a vibrational lens comprises determining an optimum length, width and or depth of the at least two focusing members; and or the optimum separation of the proximal ends of the at least two focusing members; and or the optimum separation of the distal ends of the at least two focusing members; and or the optimum distance for the at least two focusing members to converge; and or the optimum material or materials for the at least two focusing members; and or the optimum coefficient of thermal expansion of the material or materials of the at least two focusing members.

Optionally, determining the optimum length of the at least two focusing members comprises attaching brass rods of different lengths to the vibrational source to determine the resonant frequency across the operational range of the vibrational source.

Optionally, the method may further comprise determining the characteristics of a cyclic temperature variation. The characteristics including the frequency and amplitude of the cyclic temperature variation.

Optionally, providing at least two focusing members comprises providing the at least two focusing members with two or more layers and or coatings.

Optionally, determining the optimum parameters may also include determining the optimum vibrational and or thermal characteristics of the two or more layers and or coatings of the at least two focusing members.

Optionally, determining the optimum parameters may also include: determining the dimensions; and or the material composition; and or density; and or grain structure of the two or more layers and or coatings of the at least two focusing members.

Optionally, determining the optimum parameters may also include: determining the depth of a first layer and a second layer of the at least two focusing plates; the material of the first layer; and the material of the second layer.

Optionally, providing a vibrational lens comprises providing the at least two focusing members with a first layer and a second layer. The first layer having a different coefficient of thermal expansion to the second layer. The first layer may comprise brass. The second layer may comprise steel.

Embodiments of the third aspect of the invention may comprise features to implement the preferred or optional features of the first and or second aspect of the invention or vice versa.

According to a fourth aspect of the present invention there is provided a thermal energy harvesting system comprising a bimetallic strip and an energy conversion means.

Most preferably, the energy conversion means may comprise a vibration chamber. A distal end of the bimetallic strip is located within the vibration chamber.

Preferably, the vibration chamber comprises a first surface and a second surface.

Most preferably, the vibration chamber is dimensioned relative to the distal end of the bimetallic strip such that the bimetallic strip can strike the first and second surfaces of the vibration chamber. The vibration chamber is dimension to be larger than the distal end of the bimetallic strip.

Most preferably, the first and or second surfaces may comprise one or more piezoelectric crystals. The bimetallic strip may strike the one or more piezoelectric crystals located on the first and or second surfaces of the vibration chamber.

Alternatively, the energy conversion means may comprise a magnet and a coil. The magnet may be located at the distal end of the metallic strip. The coil may be centred about the magnet. The coil may be orientated relative to the magnet such that any deflection of the bimetallic strip moves the magnet within the centre of the coil.

Embodiments of the fourth aspect of the invention may comprise features to implement the preferred or optional features of the first, second and or third aspect of the invention or vice versa.

According to a fifth aspect of the present invention there is provided a method of manufacturing a bimetallic strip comprising:

determining the characteristics of a cyclic temperature variation;

determining the optimum parameters of the bimetallic strip for use with the cyclic temperature variation; and providing a bimetallic strip comprising a first layer and a second layer, according to the optimum parameters.

Preferably, determining the characteristics of the cyclic temperature variation may comprise determining the amplitude and or frequency of the cyclic temperature variation.

Preferably, determining the optimum parameters comprises determining the optimum length, width and or depth of the bimetallic strip; and or the optimum depth of the first and or second layer; and the optimum material of the first layer and or the second layer.

Optionally, providing a bimetallic strip may comprising providing three or more layers. The three or more layers may each comprises different materials.

Embodiments of the fifth aspect of the invention may comprise features to implement the preferred or optional features of the first, second, third and or fourth aspect of the invention or vice versa.

According to a sixth aspect of the present invention there is provided a vibrational lens comprising at least two focusing members, each of the at least two focusing members having a proximal end and a distal end, wherein the separation between the distal ends of the at least two focusing members is less than the separation between the proximal ends of the at least two focusing members.

Embodiments of the sixth aspect of the invention may comprise features to implement the preferred or optional features of the first, second, third, fourth and or fifth aspect of the invention or vice versa.

BRIEF DESCRIPTION OF DRAWINGS

There will now be described, by way of example only, various embodiments of the invention with reference to the drawings, of which:

FIG. 8 presents a flow chart of the method of manufacturing the vibrational lens of FIG. 1.

FIG. 14 presents a flow chart of the method of manufacturing the bimetallic strip of FIG. 10;

Figure 1:
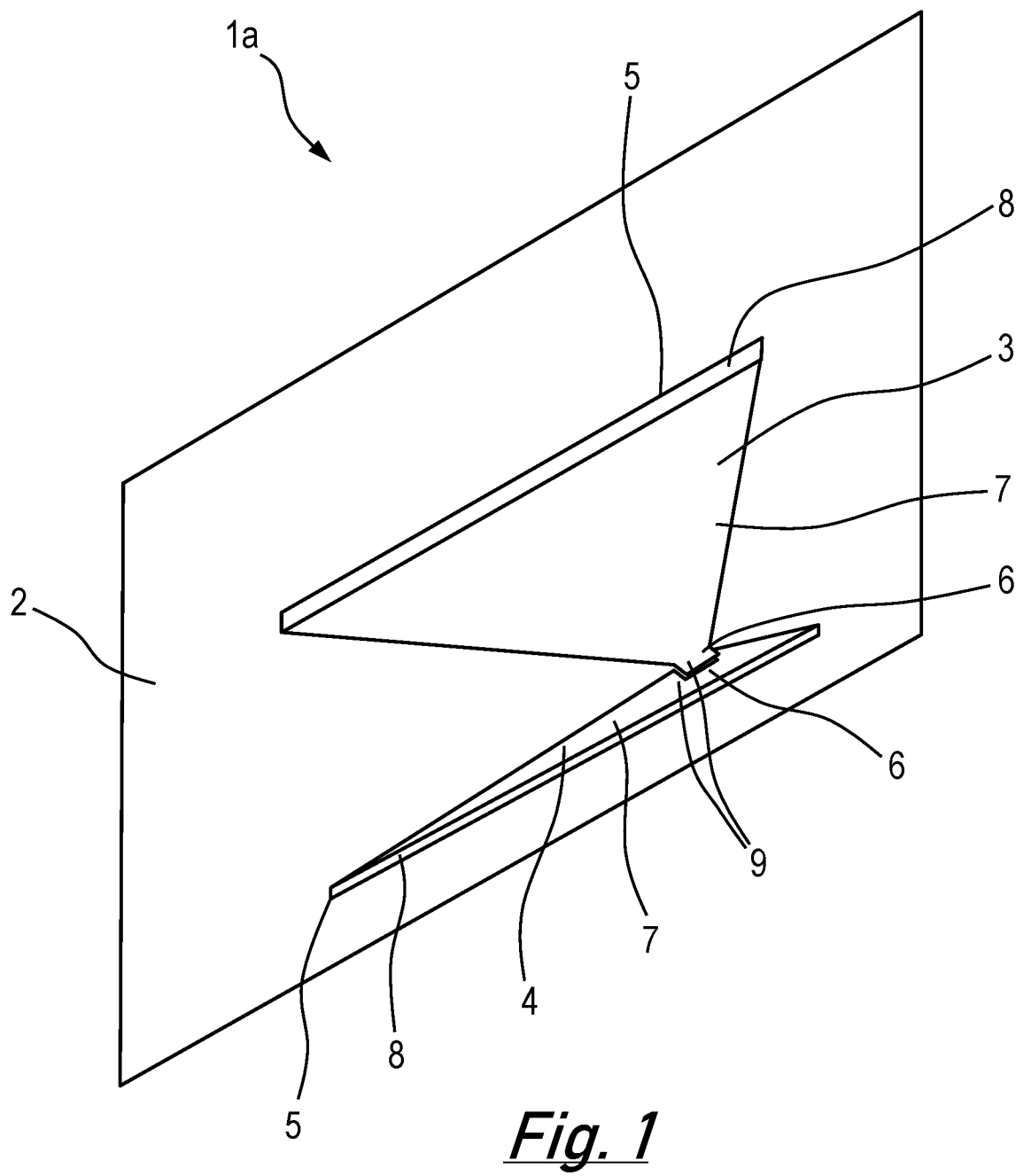
FIG. 1 presents a perspective view of a vibrational lens in accordance with an embodiment of the present invention.

In the description which follows, like parts are marked throughout the specification and drawings with the same reference numerals. The drawings are not necessarily to scale and the proportions of certain parts have been exaggerated to better illustrate details and features of embodiments of the invention.

DETAILED DESCRIPTION OF THE PREFERRED EMBODIMENTS

An explanation of the present invention will now be described with reference to FIGS. 1 to 16.

Vibrational Lens

Figure 2:
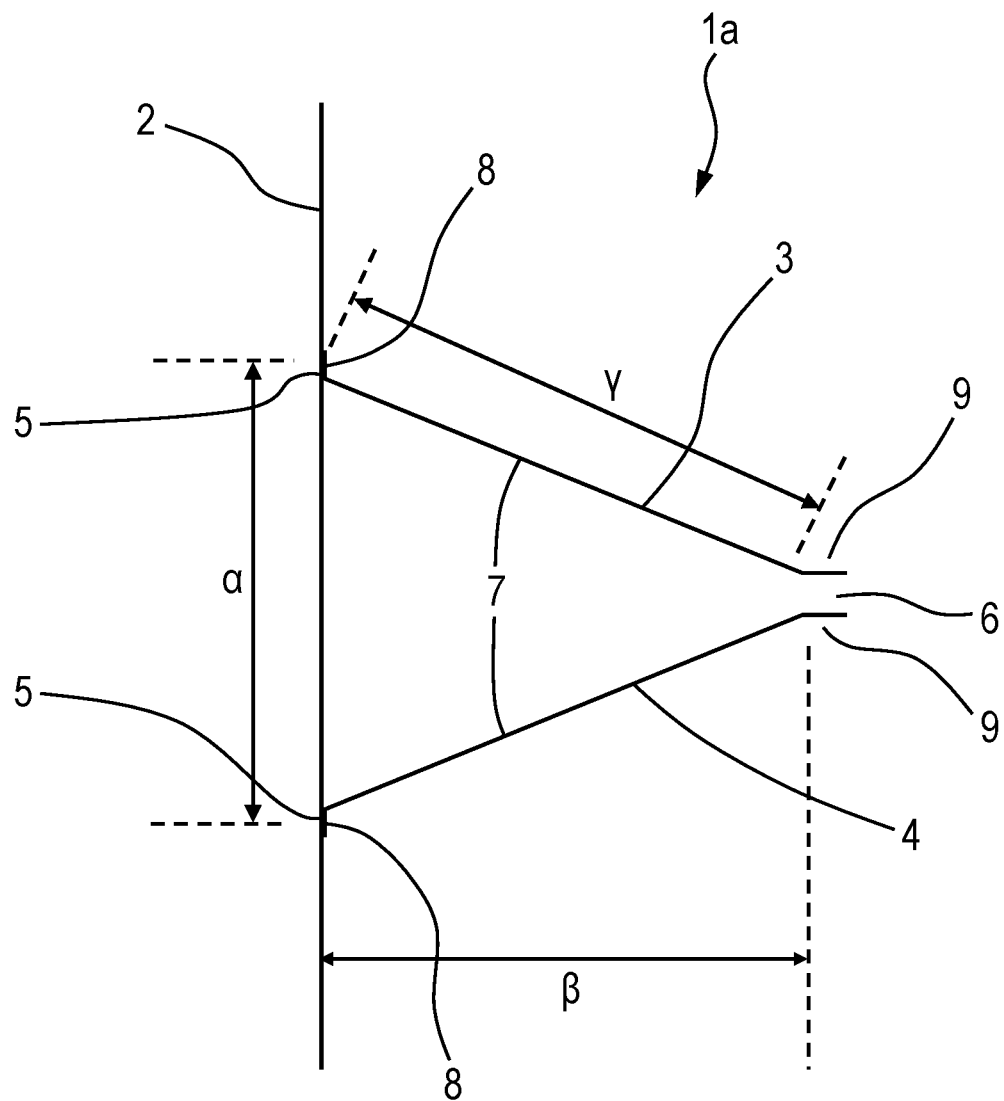
FIG. 2 presents a schematic cross-sectional view of the vibrational lens of FIG. 1.

FIGS. 1 and 2 depict a vibrational lens 1a. The vibrational lens 1a comprises a backplate 2 and two focusing members. The focusing members take the form of a first focusing plate 3 and a second focusing plate 4. The first and second focusing plates 3, 4 each have a proximal end 5 and a distal end 6. The first and second focusing plate 3, 4 each comprise a first portion 7, having a length γ, located between a second portion 8, at the proximal end 5, and a third portion 9, at the distal end 6.

The second portion 8 of the first and second focusing plates 3, 4 is fixed to the backplate 2. As shown in FIG. 1, the second portion 8 is angled to be substantially parallel and in contact with the backplate 2 such that the second portion 8 is fixed to the backplate 2 by welding. In addition to or as an alternative to welding, the fixture means may take the form of an adhesive, a nut and a bolt, rivets, a combination thereof or any other suitable alternative.

The second portions 8 of the first and second focusing plates 3, 4 are fixed to the backplate 2 at substantially the same orientation and separated by distance α, as can be seen in FIG. 2.

As can also be seen in FIG. 2, the first portions 7 of the first and second focusing plates 3, 4, are angled relative to the backplate 2 such that they converge towards each other. In the presently described embodiment, the first portions 7 of the first and second focusing plates 3, 4, are angled relative to the backplate 2 such that they converge towards a point at a distance β along a normal to the backplate 2 located midway (α/2) between the second portions 8 of the first and second focusing plates 3, 4.

The third portions 9 at the distal end 6 of the first and second focusing plates 3, 4 are angled to be substantially parallel, and preferably perpendicular to the backplate 2, and act as the focal point of the vibrational lens 1a.

Vibrational Energy Harvesting System

Figure 3:
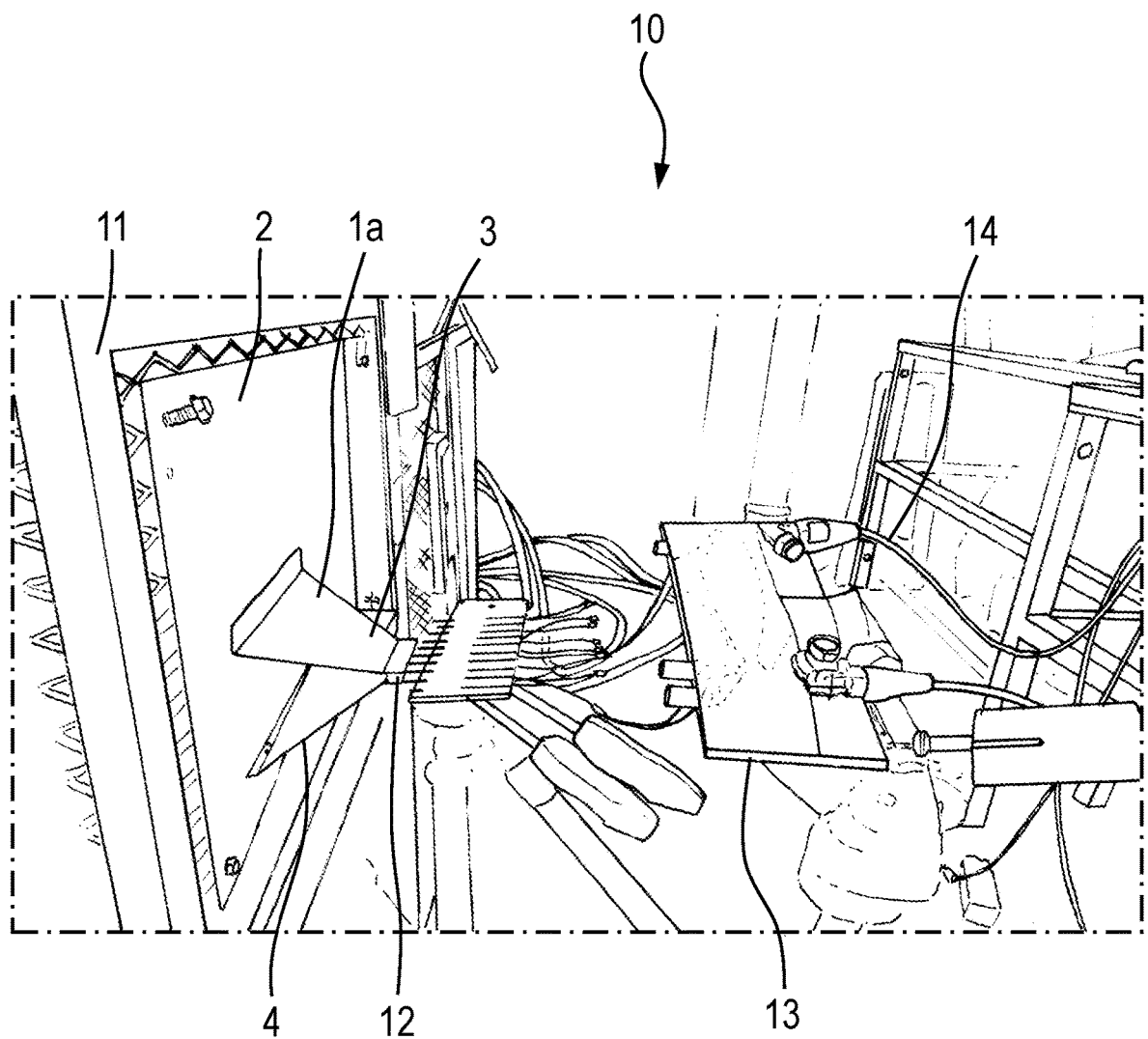
FIG. 3 presents a perspective view of a vibrational energy harvesting system comprising the vibrational lens of FIG. 1.
Figure 4:
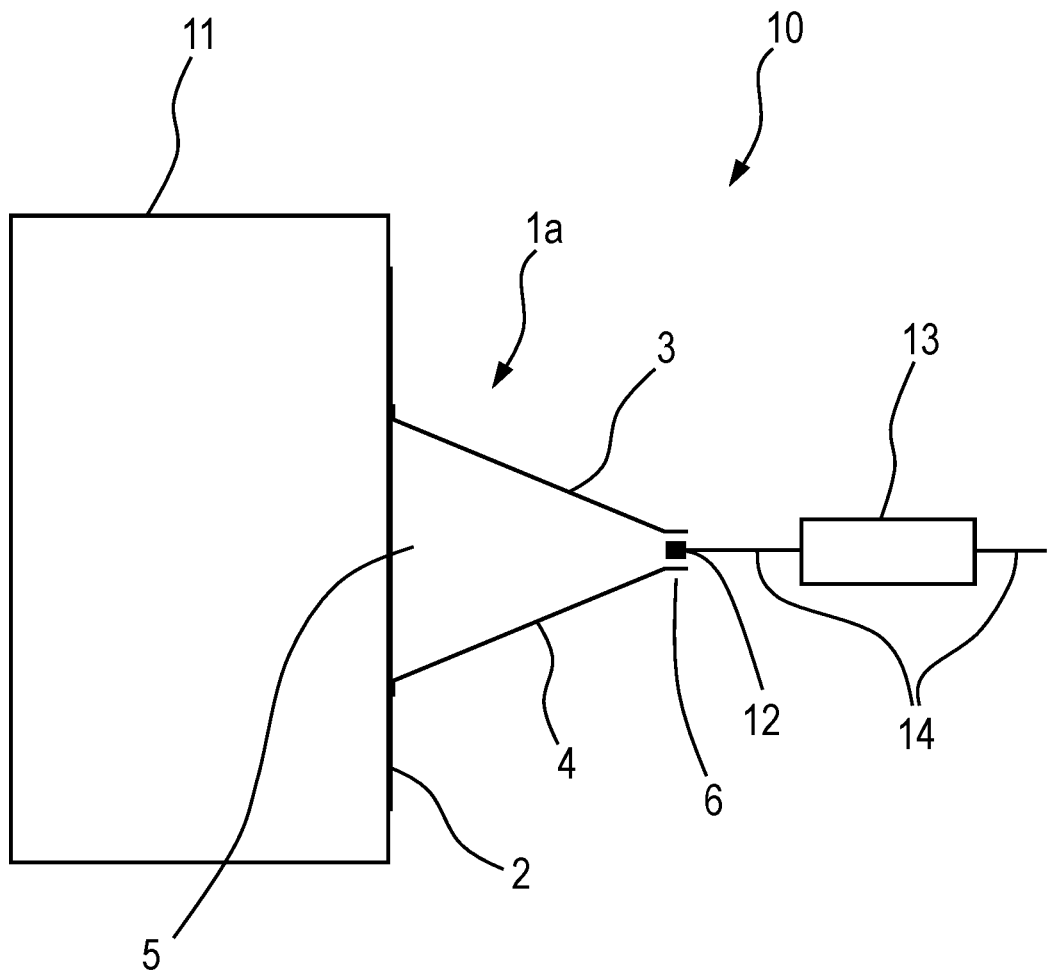
FIG. 4 presents a schematic cross-sectional view of the vibrational energy harvesting system of FIG. 3.

FIGS. 3 and 4 depict the vibrational lens 1a as part of a vibrational energy harvesting system 10. As well as the vibrational lens 1a, the vibrational energy harvesting system further comprises a vibrational source 11 and an energy conversion means 12.

As depicted in FIGS. 3 and 4, the vibrational lens 1a is attached to the vibrational source 11 which takes the form of an internal combustion engine. The backplate 2 of the vibrational lens 1a is fixed to the internal combustion engine 11, by for example nuts and bolts, welding and or any other appropriate, equivalent means or combination thereof.

As can clearly be seen in FIG. 4, located between the third portions 9 of the first and second focusing plates 3, 4 is the energy conversion means 12 which takes the form of one or more piezoelectric crystals. The piezoelectric crystals 12 are connected to electrical components 13 and directed to, for example, an appropriate electrical load (not shown) by cables 14. The one or more piezoelectric crystals 12 convert vibrational energy originating from the internal combustion engine 11 into useful electrical energy. An alternative energy conversion means could take the form of nano-coils and magnets.

Figure 5A:
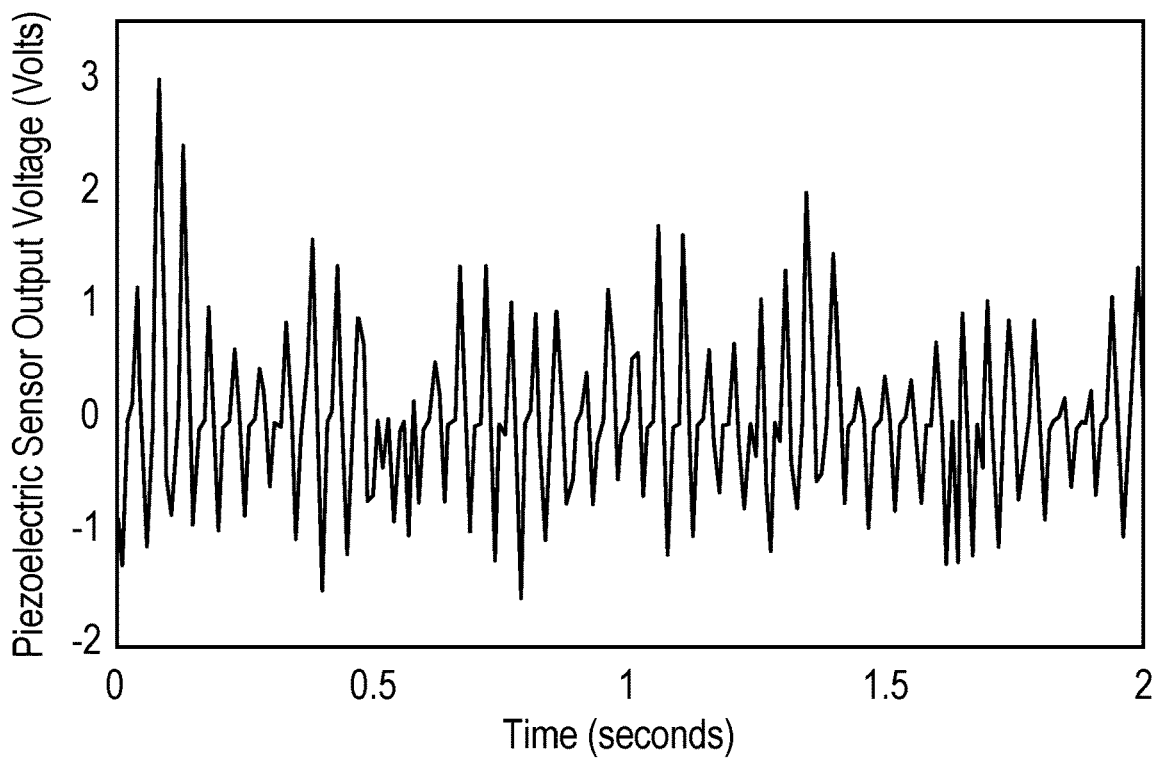
FIG. 5 presents a plot of (a) a voltage generated by a piezoelectric crystal of the vibrational energy harvesting system of FIG. 3 and (b) a voltage generated by a reference piezoelectric crystal.
Figure 5B:
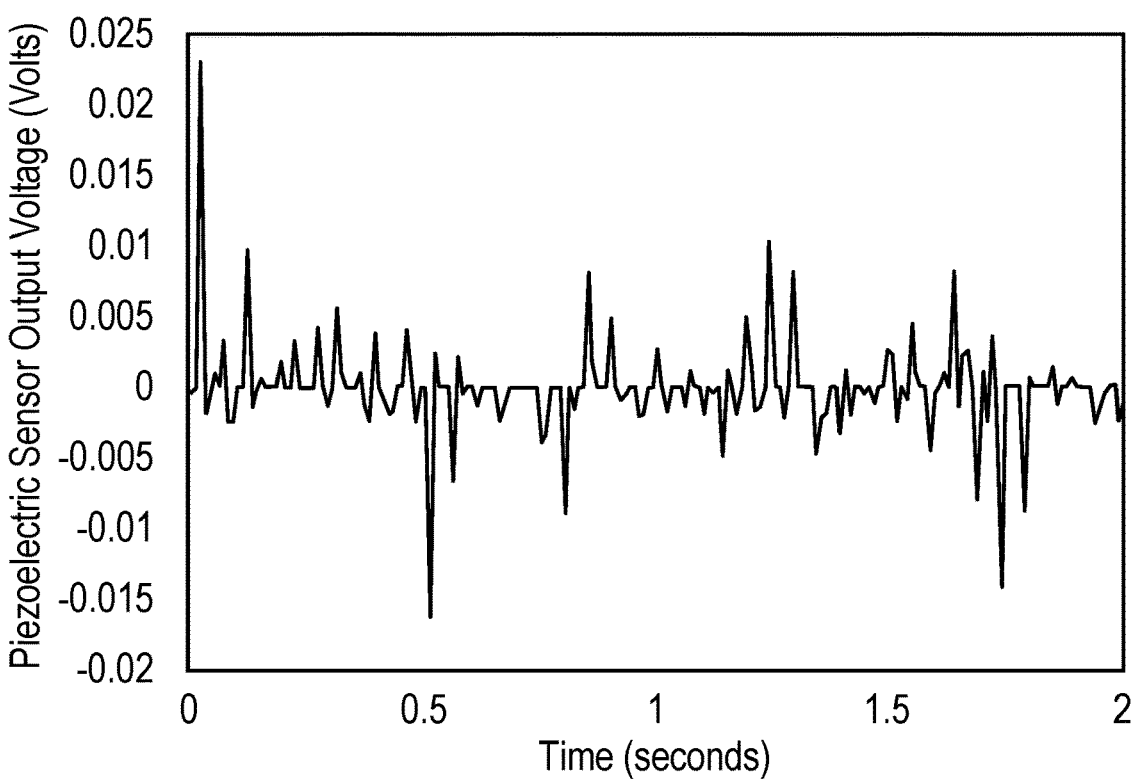

FIG. 5a shows the voltage as a function of time, generated by a piezoelectric crystal 12 located between the third portions 9 of the first and second focusing plates 3, 4 of the vibrational lens 1a. FIG. 5a depicts a root mean-square voltage of 0.743 V. FIG. 5b shows the voltage as a function of time, generated by a reference piezoelectric crystal (not shown in the Figures) directly attached the internal combustion engine 11. FIG. 5b depicts a root mean-square voltage 0.003 V. The piezoelectric crystal 12 between the third portions 9 generates a voltage approximately 248 times greater than the voltage of the reference piezoelectric crystal.

The reason for this is that vibrational lens 1a transmits, converges and focuses vibrations from the proximal end 5 to the distal end 6 of the focusing plates 3, 4. As such, the focusing plates 3, 4 could be considered equivalent to a cantilever as the proximal end 5 of each focusing plate 3, 4 is fixed to the backplate 2, and the distal end 6 is free to move, actuating the piezoelectric crystals 12.

The focusing plates 3, 4 are substantially triangular, as can clearly be seen in FIG. 1. The proximal end 5 of the focusing plates 3, 4 are equivalent to the base of a triangle and the distal end 6 equivalent to the (truncated) tip of a triangle. The triangular shape of the focusing plates 3, 4 minimises the space required to house the vibrational lens 1a at the perpendicular distance β from backplate 2 whilst maintaining functionality.

The vibrational lens 1a depicted in FIGS. 1 to 4 is made from brass due to the relatively high density of brass which facilitates efficient transmission of vibrational energy through the vibrational lens 1a. The vibrational lens 1a may alternatively be made from other metals, alloys or even non-metallic materials, such as ceramics, suitable for transmitting vibrational energy.

Figure 6:
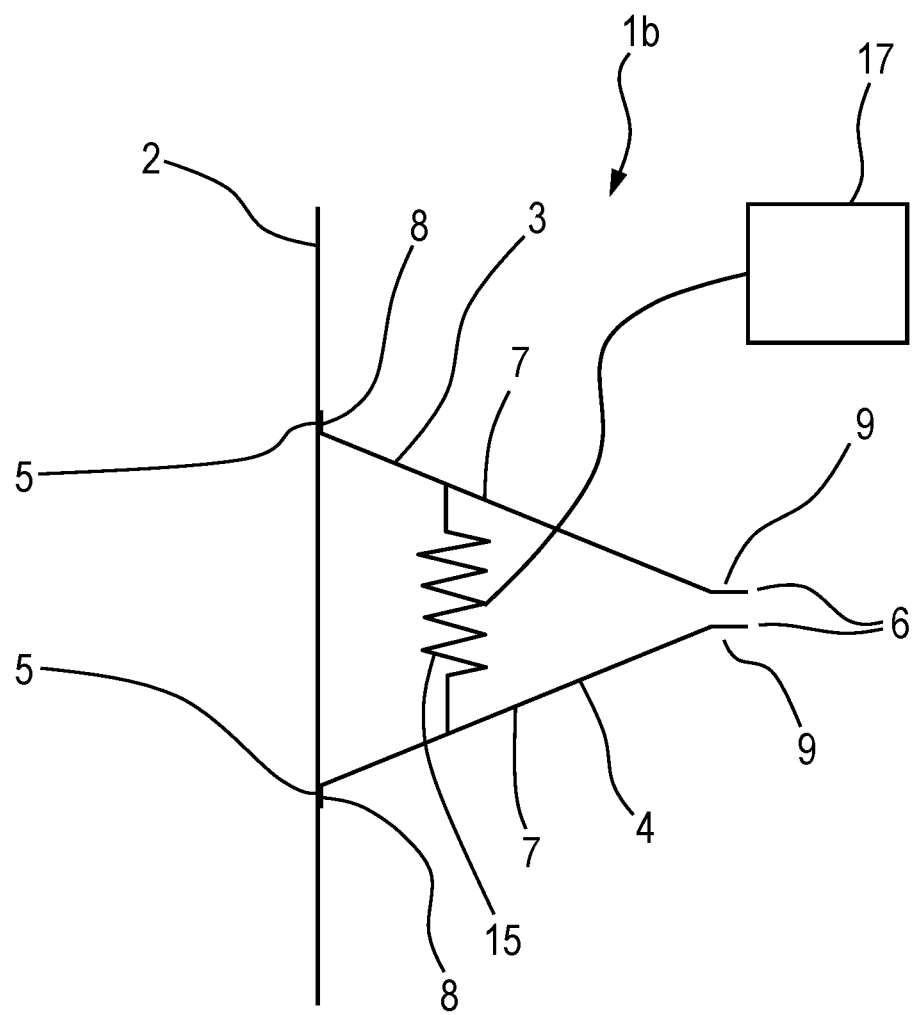
FIG. 6 presents an alternative embodiment of the vibrational lens of FIG. 1.
Figure 7:
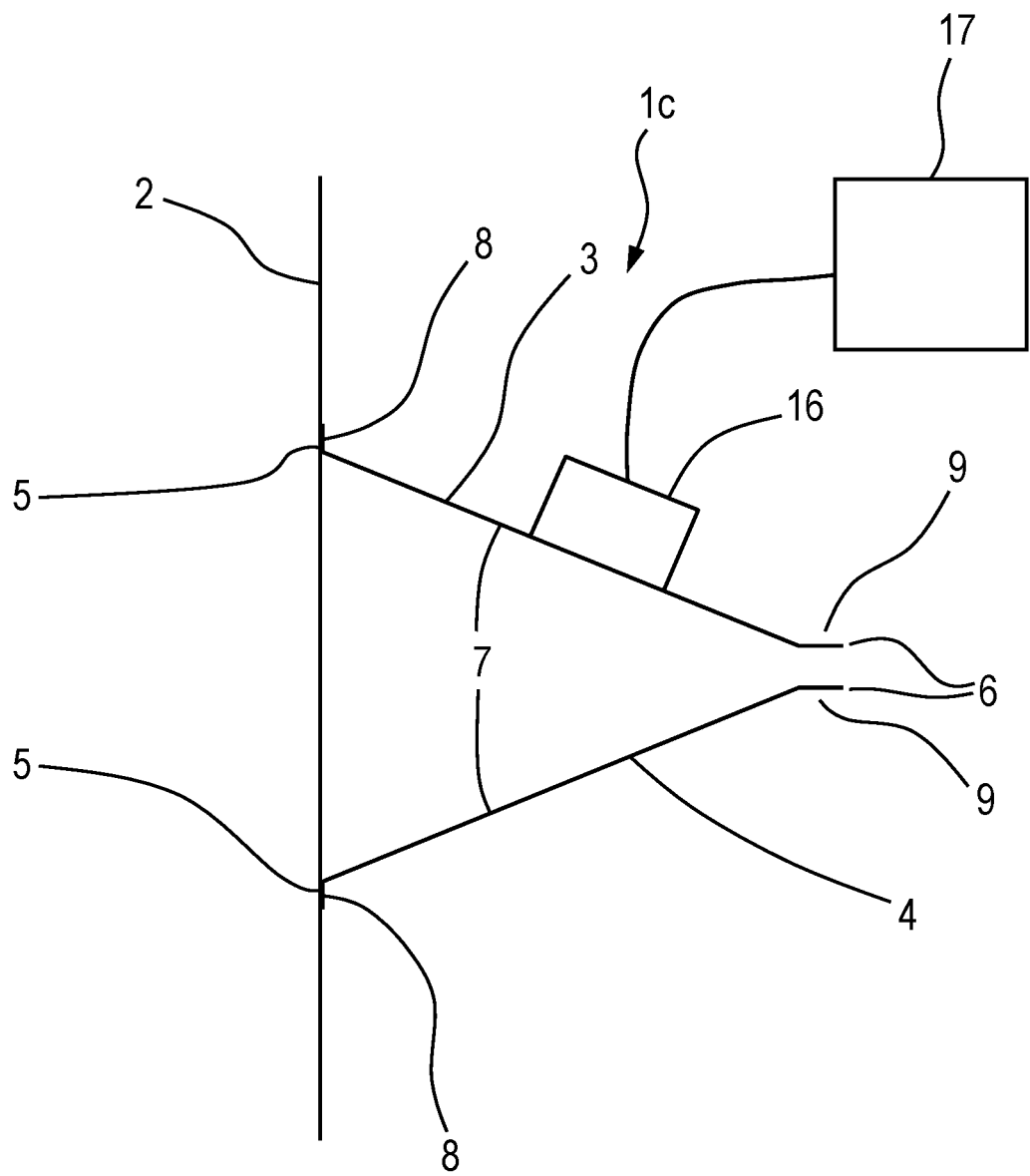
FIG. 7 presents a further alternative embodiment of the vibrational lens of FIG. 1.

As an additional or alternative feature, the vibrational lens 1b of FIG. 6, further comprises a spring 15 between the first and second focusing plates 3, 4. It will be appreciated that the vibrational lens 1b could comprise multiple springs 15. Similarly, as a further additional or alternative feature the vibrational lens 1c of FIG. 7, further comprises a weight 16 attached to the first focusing plates 3. Again, it will be appreciated that the vibrational lens 1c may comprise multiple weights 16 of equal or non-equal weights located on both or just one of the first and second focusing plates 3, 4. As a further alternative the vibrational lens 1 may comprise both a spring 15 and a weight 16. Both the spring 15 and the weight 16 modify the vibrational characteristics of the vibrational lens 1b, 1c by damping and or changing the resonant frequency of the vibrational lens 1b, 1c, which provides a mechanism to optimise the characteristics of the vibrational lens 1b, 1c. FIGS. 6 and 7 show the vibrational lens 1b, 1c may additionally comprise a dynamic control system 17 to dynamically adjust the stiffness of the spring 15 and or location of the weight 16 on the first and or second focusing plates 3, 4 and or the magnitude of the weight 16 on the first and or second focusing plates 3, 4. For example, the weight 16 may take the form of a container into which water may be pumped in and or out of by means of the dynamic control system 17. The dynamic control system 17 facilitates modifying the vibrational characteristics of the vibrational lens 1b, 1c during operation.

As a further alternative, the vibrational lens 1a, 1b, 1c may comprise more or less than two focusing plates 3, 4. For example, a vibrational lens 1a, 1b, 1c with just a first focusing plate 3 could actuate piezoelectric crystals 12 located at the distal end 6 of the first focusing plate 3 against the internal combustion engine 11, more specifically, a protruding portion of the internal combustion engine housing. Conversely, a vibrational lens, 1a, 1b, 1c with three focusing plates 3, 4 may comprise two sets of piezoelectric crystals 12, one set of piezoelectric crystals 12 between the distal end 6 of a first and a second focusing plates, and the other set of piezoelectric crystals between the second and third focusing plates.

As yet another alternative, instead of the vibrational lens 1a, 1b, 1c comprising a backplate 2, the focusing plates 3, 4 may be fixed directly to the vibrational source 11.

As a further alternative, instead of the vibrational lens 1a, 1b, 1c comprising focusing plates 3, 4, the focusing members could take the form of focusing rods. Advantageously, the focusing rods, such as those depicted in FIG. 9, take up less space than the focusing plates 3, 4.

As another additional or alternative feature, the focusing members may comprise multiple layers and or coatings. The different layers and or coatings may exhibit different vibrational and or thermal characteristics due to comprising, for example, different dimensions, materials, densities and or grain structures.

Figure 15:
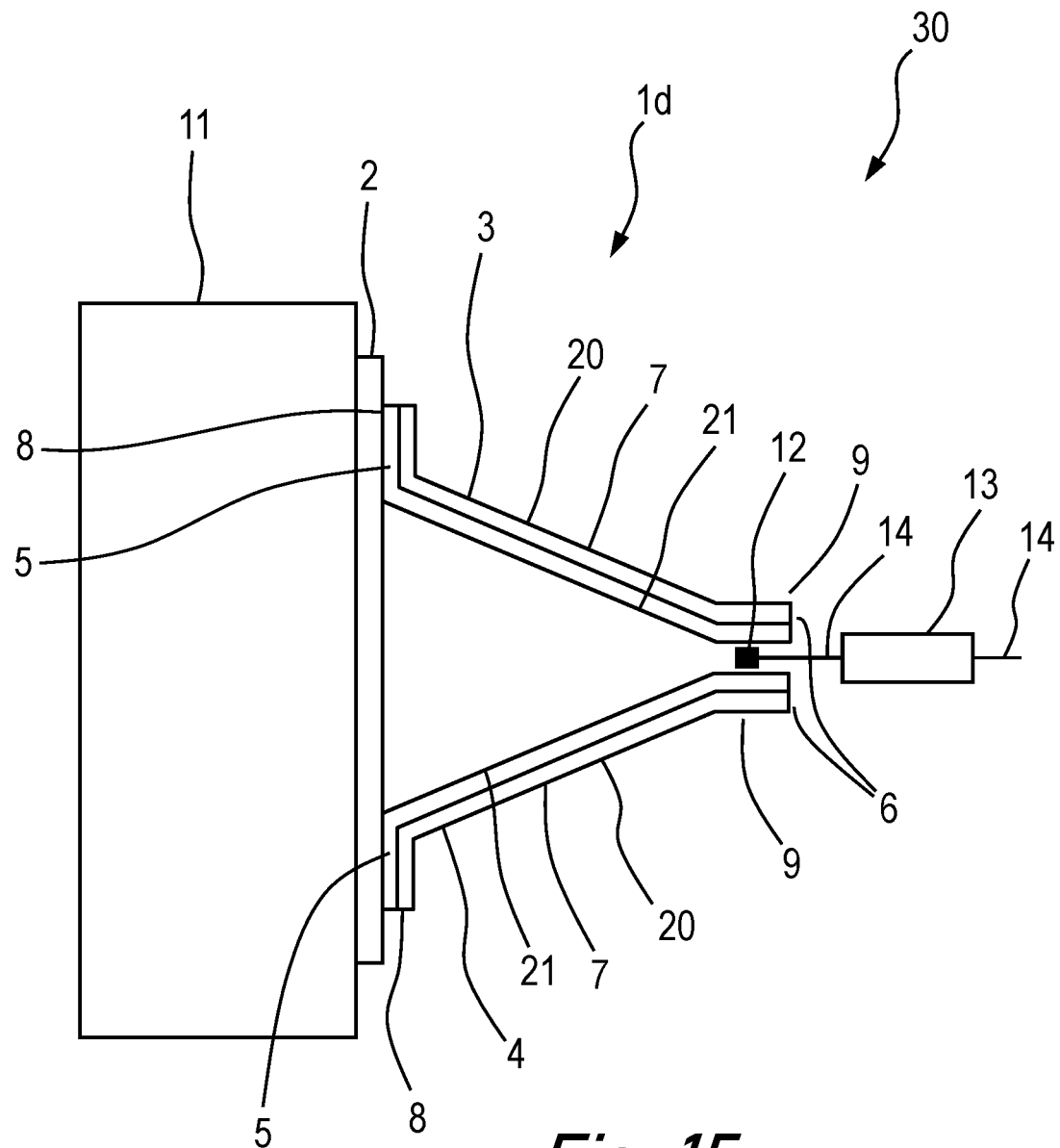
FIG. 15 presents a schematic cross-sectional view of a combined vibrational and thermal energy harvesting system in accordance with the present invention.

For example, FIG. 15 depicts focusing plates 3, 4 comprising a first, outer layer 20d and a second, inner 21d layer. The second, inner layer 21d may be less dense than the first, outer layer 20d. It is found this arrangement improves the transmission of vibrations through the vibrational lens 1. As another example, the grain structure of the first, outer layer 20d may be more aligned in comparison to the grain structure of the second, inner layer 21d. Again, this arrangement improves the transmission of vibrations through the vibrational lens 1. As a further example, the first, outer layer 20d may have a different coefficient of thermal expansion in comparison to the second, inner layer 21d, in other words the first layer 20d is made from brass and the second layer 21d is made from steel. This arrangement induces vibrations and mimics the thermal properties of a bimetallic strip, as discussed in more detail below. The planar layers 20d, 21d of the focusing plates 3, 4 as depicted in FIG. 15 are equivalent to concentric layers and or coatings of a focusing rod.

In addition, it is further noted the relative physical properties of the first, outer layer 20d and the second, inner layer 21d may be reversed such that, for example, the second, inner layer 21d may be more dense than the first, outer layer 20d. As a further alternative, the grain structure of the first, outer layer 20d may be less aligned in comparison to the grain structure of the second, inner layer 21d. The physical properties of the different layers such as the dimensions, materials, densities and or grain structures are optimised according to the desired vibrational and or thermal characteristics which ultimately depends on frequency characteristics of the vibrational source 11.

Method of Manufacturing a Vibrational Lens

Figure 9:
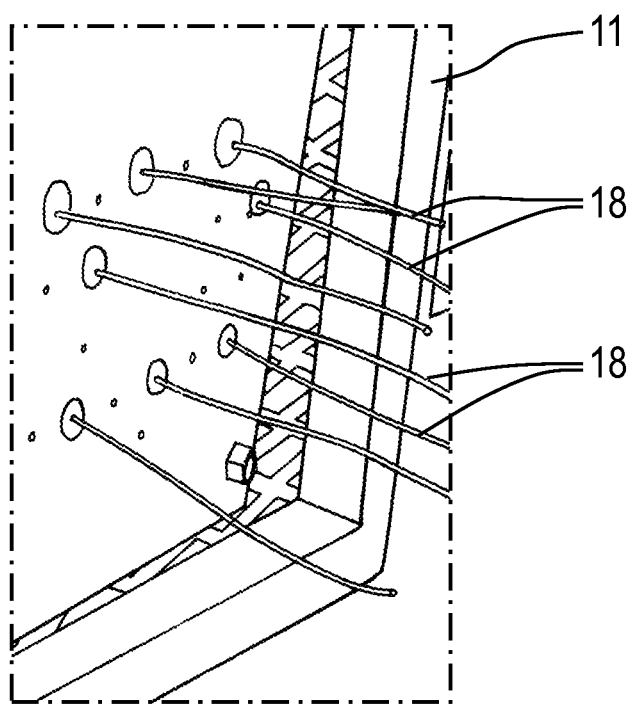
FIG. 9 presents a perspective view of an apparatus used in the method of manufacture of FIG. 8.

A method of manufacturing of the vibrational lens 1a, 1b, 1c will now be described with reference to FIGS. 8 and 9.

FIG. 8 shows a flow chart of the method of manufacturing the vibrational lens 1a, 1b, 1c The vibrational lens 1a, 1b, 1c is manufactured such that it is optimised for a specific vibrational source such as an internal combustion engine 11. First, the characteristics of the internal combustion engine 11, are determined (S1001). For example, Table I shows the change in noise level, engine gas temperature, output power, torque and ambient temperature for the internal combustion engine 11, as the engine speed increases from 1260 to 3200 rpm.

TABLE I

Characteristic parameters of an internal combustion engine

| Revolutions Per Minute (rpm) | Noise Level (dB) | Exhaust Gas Temperature (° C.) | Power (kW) | Torque (Nm) | Ambient Temperature (° C.) |
|---|---|---|---|---|---|
| 1260 | 85.6 | 127 | 1.99 | 15.3 | 13.1 |
| 1318 | 85.2 | 121 | 1.60 | 12.2 | 11.6 |
| 1620 | 86.3 | 122 | 1.83 | 11.2 | 12.7 |
| 1890 | 90.9 | 118 | 1.29 | 6.5 | 13.1 |
| 2218 | 93.1 | 133 | 1.49 | 6.5 | 12.9 |
| 2520 | 97.3 | 152 | 1.72 | 6.4 | 14.3 |
| 2818 | 98.4 | 158 | 1.97 | 6.7 | 14.4 |
| 3200 | 100.9 | 178 | 2.63 | 7.7 | 14.1 |
| 3444 | 101.2 | 208 | 3.60 | 9.9 | 14.8 |

More specifically, from the lowest to highest rpm, the noise level increases by nearly 20 dB corresponding to the internal combustion engine 11 being approximately 4 times louder at the highest rpm and also indicating the vibrational energy loss within the internal combustion engine 11 increases with rpm. Similarly, the exhaust gas temperature increase from 127 to 208° C. from the lowest to highest rpm, indicating an increase in thermal loss from the internal combustion engine.

The method of manufacture further comprises the step of determining the optimum parameters for a vibrational lens 1a, 1b, 1c for harvesting the vibrational energy from a vibrational source, such as an internal combustion engine 11, as previously characterised (S1002). This includes determining the shape and dimensions of the vibrational lens 1a, 1b, 1c, such as, distances α, β and γ. More specifically, the optimisation may include dimensioning the length γ of the focusing plates 3, 4, to match an average resonant frequency across the operational range of the internal combustion engine (1260 to 3444 rpm). FIG. 9 shows brass rods 18 of varying length attached to the internal combustion engine 11. Operating the internal combustion engine 11 and monitoring which rod 18 experiences the greatest deflection and or resonance, across the range of engine speeds (rpm) is indicative of the optimum valve of γ. As indicated above, the focusing members could take the form of the brass rods 18, instead of or in addition to the focusing plates 3, 4.

The method of manufacture also comprises providing a vibrational lens 1a, 1b, 1c according to the optimum parameters (S1003). More specifically, the focusing plates 3, 4 of the vibrational lens 1a, 1b, 1c are provided by water jet cutting brass plates to the required dimensions and introducing appropriate bends in focusing plates 3, 4. The focusing plates 3, 4 are welded to the backplate 2.

The method of manufacture may comprise optional additional steps of further optimising the parameters of the vibrational lens 1a, 1b, 1c according to factors such as the type of energy conversion means located at the distal end 6 of the focusing plates 3, 4, the number of focusing plates 3, 4 the vibrational lens 1a, 1b, 1c comprises, the space available to house the vibrational lens 1a, 1b, 1c and more generally the operational constraints and desired performance characteristics. For example, the first portions 7 of the first and second focusing plates 3, 4 are not limited to converging midway between the second portions 8 of the first and second focusing plates 3, 4. In other words, the first portions 7 of the focusing plates 3, 4 may be asymmetrically angled relative to the backplate 2 to fit within the available space for housing the vibrational lens 1a, 1b, 1c and or fora desired performance of the vibrational lens 1a, 1b, 1c.

Bimetallic Strip

Figure 10:
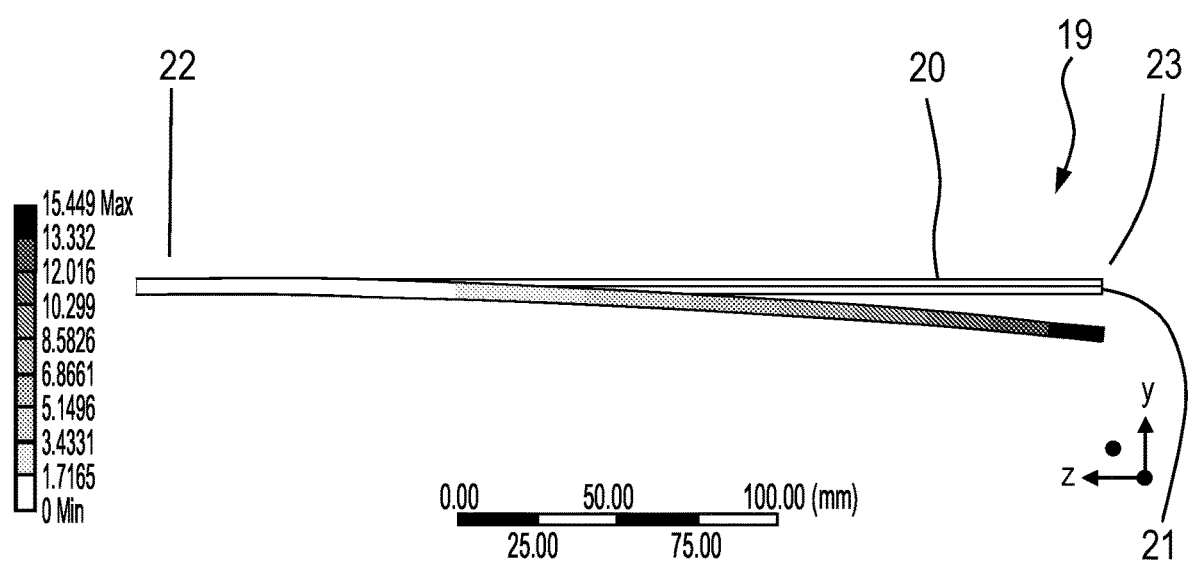
FIG. 10 presents a cross-sectional view of a bimetallic strip in accordance with the present invention and the deflection of the bimetallic strip associate with a temperature change from 22° C. to 150° C. as calculated from finite element modelling.

FIG. 10 depicts a bimetallic strip 19 comprising a first layer 20 and a second layer 21. The first 20 and second 21 layers are fixed together, along the length and width of the bimetallic strip 19, by means of: welding, an adhesive, nuts and bolts, rivets, a combination thereof or any other suitable alternative. The first layer 20 is made from brass and the second layer 21 is made from steel.

The first 20 and second 21 layers expand, or contract, at different rates in response a temperature change, as brass has a different coefficient of thermal expansion (CTE) in comparison to steel. The CTE for brass is $1.9 \times 10^{-5}$ $°C.^{-1}$ at 22° C. and the CTE for steel is CTE of $1.01 \times 10^{-5}$ $°C.^{-1}$ at 22° C. The difference in expansion or contraction between the first 20 and second 21 layers is most pronounced along the axis of the largest linear dimension of the bimetallic strip 19, in other words, the z-axis of FIG. 10 corresponding to the length of the bimetallic strip 19. However, as the two layers 20, 21 are fixed together, instead of noting a difference in length between the two layers 20, 21, the bimetallic strip 19 bends in the in response to a temperature change.

The bimetallic strip 19 has a proximal end 22 and distal end 23. The proximal end 22 is fixed and the distal end 23 is free to move, akin to a cantilever. As shown in FIG. 10, when the bimetallic plate 19 is heated, it bends in the negative y-direction as the first layer 20 has a larger CTE, the length expansion is greater relative to the second layer 21, so the first layer 20 is on the outer side of the curve. Conversely, when the bimetallic plate 19 is cooled, it bends in the positive y-direction. In short, the bimetallic strip 19 converts variations in temperature into the mechanical displacement.

More specifically, FIG. 10 shows the result of finite element modelling of the thermal expansion of the bimetallic strip 19 undergoing a temperature change from 22° C. to 150° C. The bimetallic strip 19 has a length of 300 mm along the z-axis, a width of 10 mm along the x-axis and a total depth of 5 mm along the y-axis. The first and second layers 20, 21 each layer has a depth of 2.5 mm. FIG. 10 shows the distal end 23 of the bimetallic strip 19 has a maximum deflection of 15 mm.

Figure 11:
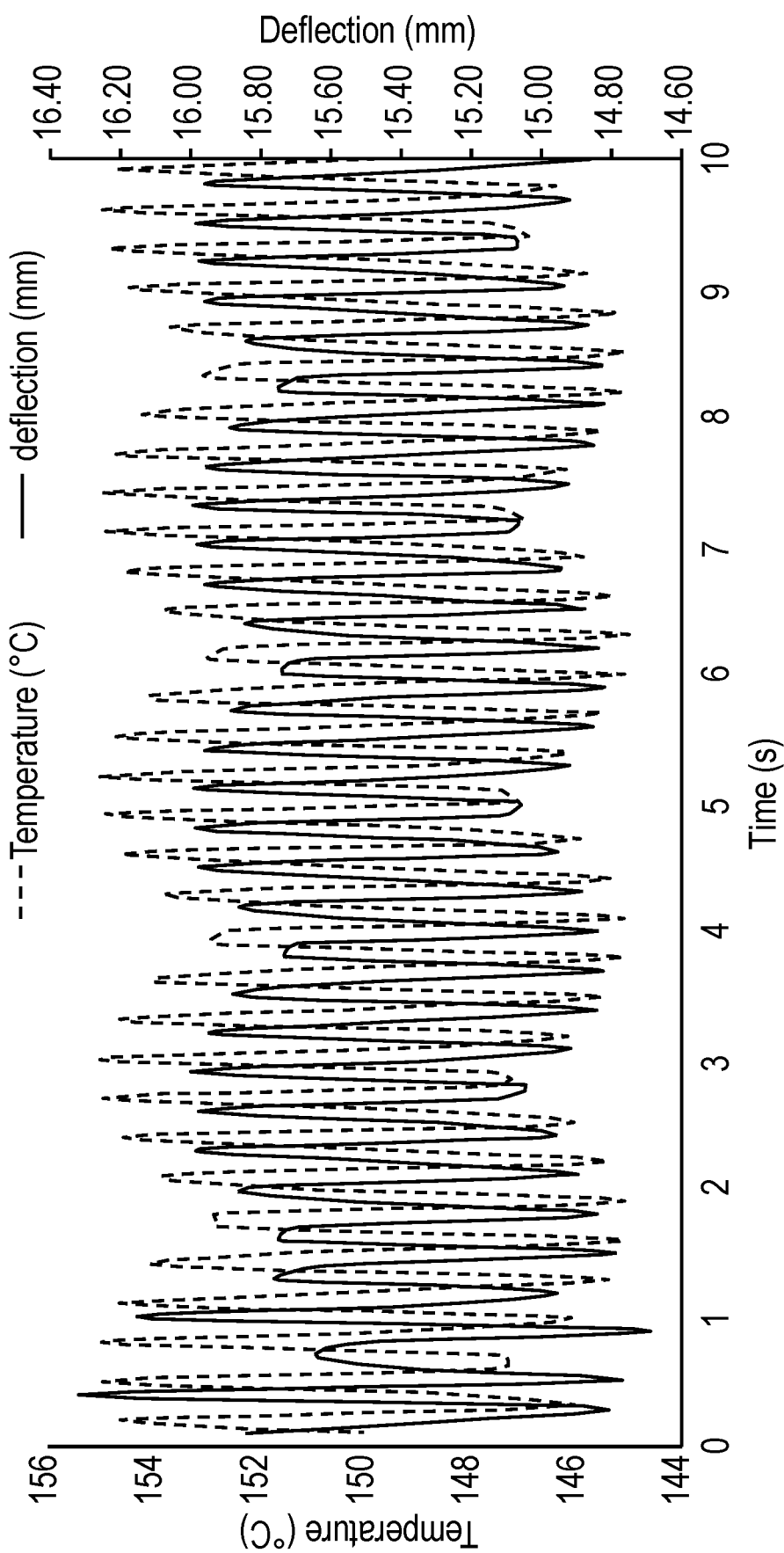
FIG. 11 presents a plot of temperature and the deflection of bimetallic strip of FIG. 10 as a function of time.

As an extension of the finite element modelling of FIG. 10, FIG. 11 shows the variation in the deflection of the distal end 23 of the bimetallic strip 19 as a function of time, when the temperature cycles between 145° C. and 155° C. The deflection experiences a cyclic change between approximately 14.8 to 15.9 mm. FIG. 11 demonstrates that a cyclic temperature variation can be converted into a cyclic mechanical deflection.

Thermal Energy Harvesting System

Figure 12:
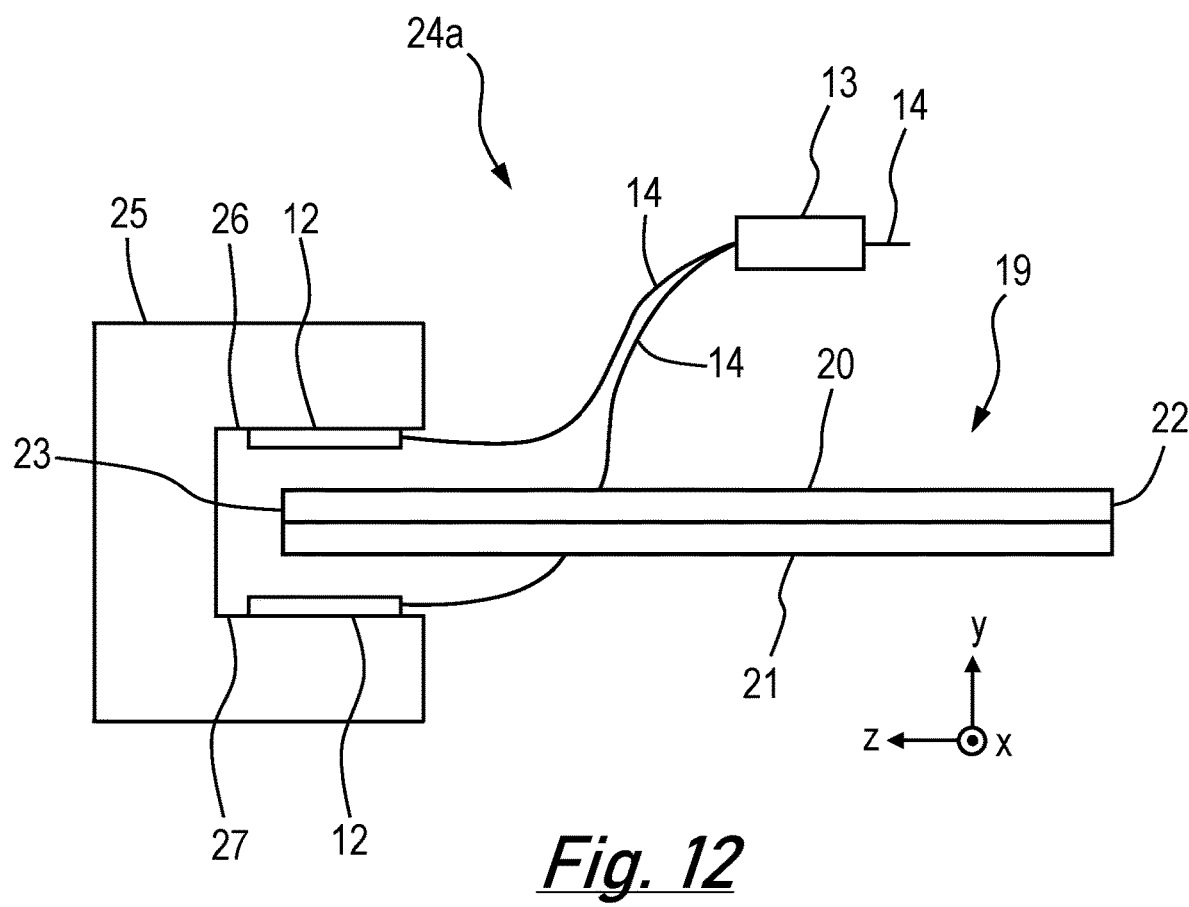
FIG. 12 presents a schematic cross-sectional view of a thermal energy harvesting system comprising the bimetallic strip of FIG. 10.

FIG. 12 depicts a thermal energy harvesting system 24a comprising the bimetallic strip 19 as described above and an energy conversion means which takes the form of a vibration chamber 25. The distal end 23 of the bimetallic strip 19 is located within the vibration chamber 25. The vibration chamber 25 is dimensioned such that as the distal end 23 of the bimetallic strip 19 periodically cycles between a deflection of, for example 14.8 to 15.9 mm, the distal end 23 strikes a first surface 26 and a second surface 27 of the vibration chamber 25. The first 26 and second 27 surfaces comprise piezoelectric crystals 12 such that the mechanical movement of the bimetallic strip 19 is converted into electrical energy. As before, the piezoelectric crystals 12 are connected to electrical components 13 and directed to an appropriate electrical load (not shown) by cables 14. In summary, the thermal energy harvesting system 24 converts thermal energy into mechanical energy, which is in turn converted into electrical energy.

Figure 13:
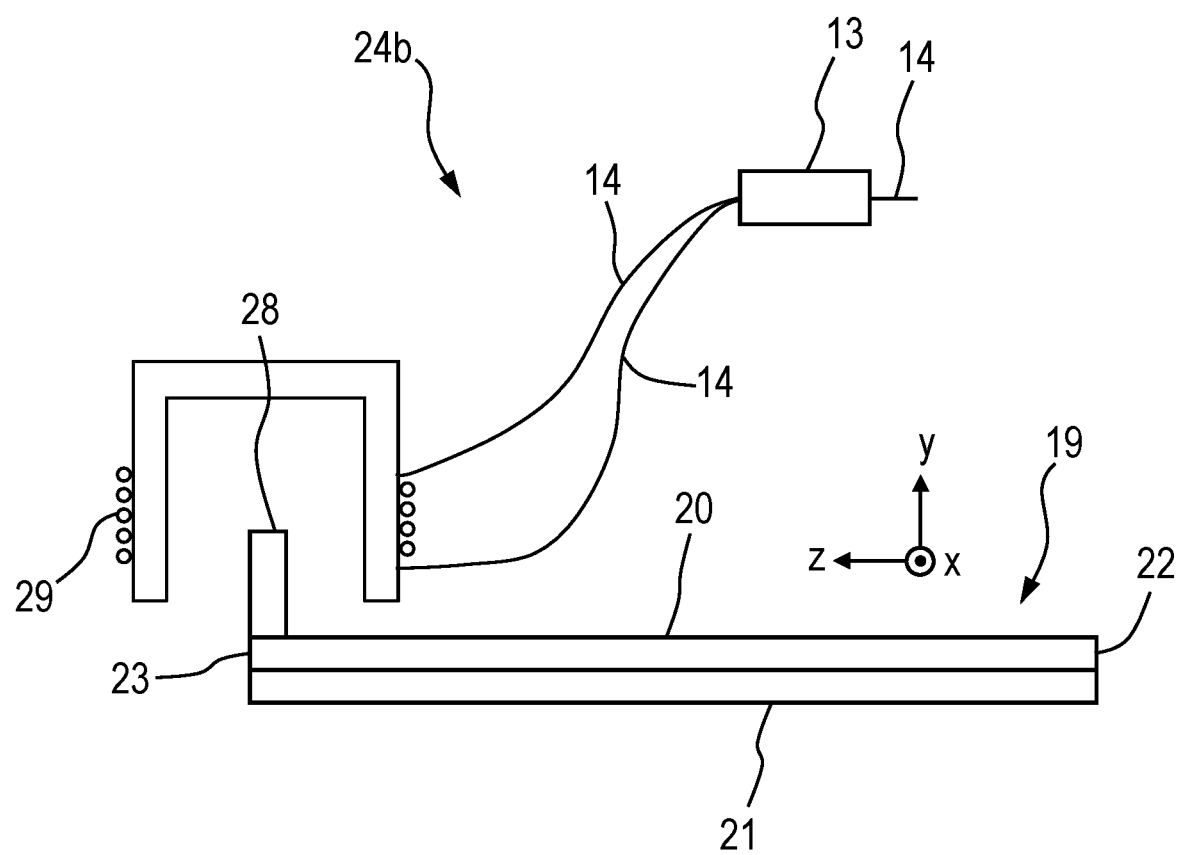
FIG. 13 presents a schematic cross-sectional view of an alternative thermal energy harvesting system comprising the bimetallic strip of FIG. 10.

In an alternative embodiment of the thermal energy harvesting system 24b, the energy harvesting means may take the form of a magnet 28 and a coil 29. For example, as shown in FIG. 13, the magnet 28 is located at the distal end 23 of the metallic strip 19, protruding along the y-axis, in the direction of the deflection. The coil 29 is orientated relative to the magnet 28 such that the deflection of the bimetallic strip 19 periodically moves the magnet 28 within the centre of the coil 29, resulting in a change in magnetic flux and inducing a current in the coil 29.

Method of Manufacturing a Bimetallic Strip

FIG. 14 depicts a flow chart describing a method of manufacturing the bimetallic strip 19.

The bimetallic strip 19 is manufactured such that it is optimised for a specific cyclic temperature variation, such as, the cyclic temperature change experienced by a cylinder within an internal combustion engine 11. The cylinder experiences a periodic burn of fuel to drive a piston contained within the cylinder. The method of manufacture comprises, first, characterising a cyclic temperature variation (S2001). For example, the temperature may cycle between 145 to 155° C., as assumed above in the context of the finite element modelling.

For the bimetallic strip 19 to be sensitive to and oscillate with this cyclic temperature variation, the method further comprises determining the optimum parameters of the bimetallic strip 19 (S2002). The x, y and z dimensions of the bimetallic strip 19 and the materials of the first and second layers 20, 21 are key parameters. For example, for a bimetallic strip to exhibit a similar deflection for a small temperature variation relative to a large temperature variation, the bimetallic strip would have to be dimensioned to be longer, and the materials chosen to have a greater mismatch between the CTE. Another factor to consider when optimising the parameters is the thermal conductivity of the chosen materials. More specifically, the maximum frequency of a cyclic temperature variation is limited by the minimum time required for the bimetallic strip 19 to exhibit a deflection in response to a temperature change.

In addition, the method comprises providing a bimetallic strip 19 (S2003) in accordance with the optimum parameters (S2002).

Combined Vibrational and Thermal Energy Harvesting System

FIG. 15 depicts an energy harvesting system, more specifically, a combined vibration and thermal energy harvesting system 30 which comprises the same and or similar features to the vibrational energy harvesting system 10 of FIGS. 3 and 4 as described above. The combined vibration and thermal energy harvesting system 30 comprises a vibrational lens 1d attached to a source of vibrational and thermal energy 11, such as an internal combustion engine, and an energy conversion means 12 which may take the form of piezoelectric crystals.

The vibrational lens 1d as depicted in FIG. 15 differs to the vibrational lens 1a, 1b, 1c as described above, in that the first 3d and second 4d focusing plates both additionally comprise a first 20d and second 21d layer. Instead of the focusing plates 3, 4 just being made from a single material, the first layer 20d of the focusing plates 3d, 4d is made from brass and the second layer 21d is made from steel, mimicking the layered structure and, consequently, the resulting thermal properties of the bimetallic strip 19.

The vibrational lens 1d of FIG. 15 harvests both the vibrational and thermal energy from the internal combustion engine 11. A cyclic temperature variation from, for example, a piston within the internal combustion engine 11 is converted to a cyclic deflection in the vibrational lens 1d by means of the bimetallic structure. The vibrational lens 1d transmits, converges and focuses both the cyclic mechanical deflection induced by the cyclic temperature variation and the vibrations originating directly from the internal combustion engine 11. The vibrational lens 1d actuates a piezoelectric crystal 12 which converts both the vibrational and thermal energy into useful electricity.

Method of Manufacturing a Vibrational Lens with a Bimetallic Structure

A method of manufacturing the vibrational lens 1d for the combined vibrational and thermal energy harvesting system comprises a combination of the steps in FIGS. 8 and 14.

The method comprises first characterising both the vibrational and thermal characteristics of the source of vibrational and thermal energy (S1001, S2001). This includes quantifying the frequency and amplitude of the cyclic temperature variation as well as the resonant frequency across the operational range of the energy source.

The method further comprises determining the optimum parameters for a vibrational lens 1d with an integral bimetallic structure for use with a source of vibrational and thermal energy (S1002, S2002). This includes determining the dimensions of the focusing plates 3d, 4d, including parameters α, β and γ as well as the depths of the first and second layers 20d, 21d and the material composition. It is envisaged that determining the optimum parameters may comprise a balance between competing factors and this could be an iterative process.

The method of manufacture includes (S1003, S2003) providing a vibrational lens 1d according to the optimum parameters.

Alternative Combined Vibrational and Thermal Energy Harvesting System

Figure 16:
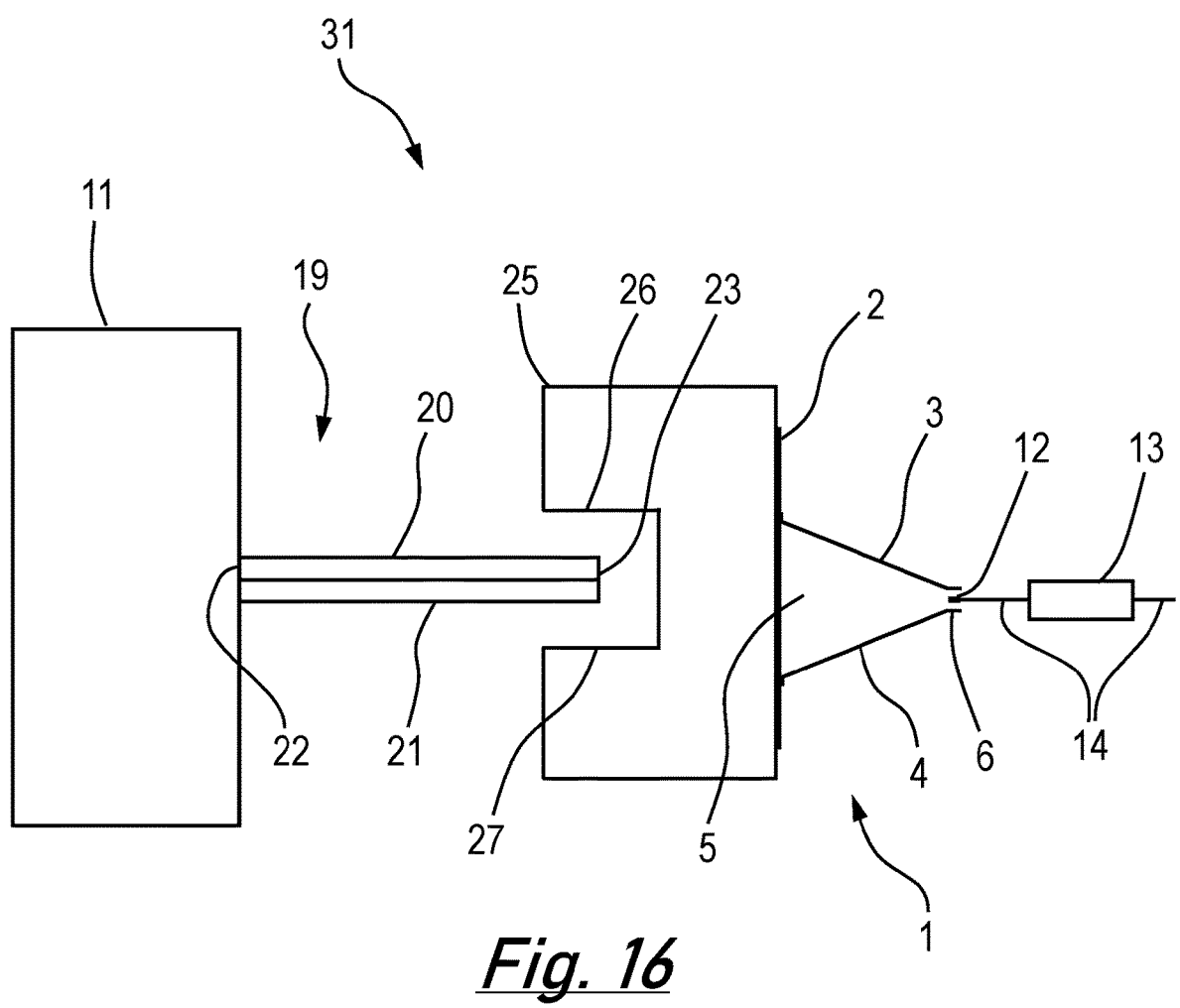
FIG. 16 presents a schematic cross-sectional view of an alternative combined vibrational and thermal energy harvesting system in accordance with the present invention.

FIG. 16 depicts an alternative combined vibration and thermal energy harvesting system 31 which comprises the same and or similar features to the vibrational energy harvesting system 10 of FIGS. 3 and 4 in conjunction with the same or similar features to the thermal energy harvesting system of FIG. 12.

The combined vibration and thermal energy harvesting system 31 comprises a vibrational lens 1a, 1b, 1c, 1d, a bimetallic strip 19 and a vibration chamber 25. Similar to FIG. 12, the bimetallic strip 19 is attached to a source of vibrational and thermal energy 11 which exhibits a cyclic temperature variation. In response to the cyclic temperature variation the bimetallic strip 19 exhibits a cyclic deflection such that the bimetallic strip 19 strikes the first and second surfaces 26, 27 of the vibration chamber 25. In contrast to FIG. 12, the vibration chamber 25 does not itself comprise an energy conversion means as, in this combined vibration and thermal energy harvesting system 31, the bimetallic strip 19 enhances the vibrations exhibited by the source 11. The vibrational lens 1a, 1b, 1c, 1d is attached to the vibration chamber 25 such that the lens 1a, 1b, 1c, 1d transmits, converges and focuses both the vibrations originating directly from the source 11 and thermally induced vibrations. An energy conversion means 12 located at the distal end 6 of the vibrational lens 1a, 1b, 1c, 1d converts the vibrational energy into useful electricity.

As an example, an internal combustion engine may comprise one or more bimetallic strips and one or more vibration chambers to convert a thermal variation exhibited by a cylinder of an internal combustion engine into vibrational energy. The vibrational energy of the engine and the induced vibrational energy is converted by means of a vibrational lens into electricity.

As an alternative, it is envisaged the vibrational lens 1a, 1b, 1c, 1d may be attached directly to the source of vibrational and thermal energy 11.

As a further alternative, it is envisaged the combined vibration and thermal energy harvesting system 31 may not comprise a vibration chamber 25 as described above, as the movement of the bimetallic strip 19 alone may be sufficient to increase the vibrations exhibited by the source 11.

A method of manufacturing the vibrational lens 1a, 1b, 1c, 1d and the bimetallic strip 19 for the combined vibration and thermal energy harvesting system 31 comprises the steps of FIGS. 8 and 14 respectively and as discussed above. A further consideration in the context of system 31, is that when determining the optimum parameters for both the vibrational lens 1a, 1b, 1c, 1d and the bimetallic strip 19 (S1002, S2002), additional consideration may be given such that the vibrations induced by the bimetallic strip 19 are resonant, matched and or correlated with the vibrational lens 1a, 1b, 1c, 1d. This may involve further iterative optimisation of the dimensions and parameters of the vibrational lens 1a, 1b, 1c, 1d and or the bimetallic strip 19.

Improving the efficiency of an internal combustion engine and an automobile by capturing and recycling the wasted vibrational and thermal energy has numerous advantages. The environmental impact of burning the fuel, typically derived from fossil fuels, is reduced and the rate at which fossil fuels, a finite resource, are depleted is also reduced. Furthermore, the cost per mile of the automobile will also be reduced due to the improved efficiency.

Vibrations and thermal losses within an internal combustion engine are typically associated with inefficiencies in performance, limits in operation (e.g. overheating), increased mechanical failure of components, a shorter lifespan of an engine and even poor comfort within an automobile. Vibrational and thermal energy within an internal combustion engine is typically wasted and as such, the norm is to minimise these losses by introducing, for example, a damping mechanism and or even thermal insulation. In contrast to this current understanding, the present invention does not minimise the vibrations and or thermal losses but instead harvests the vibrational and thermal energy. This results in the internal combustion engine being more energy efficient whilst mitigating and even obviating the need all together for mechanisms to minimise these losses. This can result in cost savings by not having to install expensive damping mechanisms to an internal combustion engine.

A vibrational lens is disclosed. The vibrational lens comprises at least two focusing plates each having a proximal and distal end. The separation between the distal ends of the at least two focusing plates is less than the separation between the proximal ends of the at least two focusing plates. The vibrational lens transmits, converges and focuses vibrational energy from a source to an energy conversion means such as piezoelectric crystals. The vibrational lens may also comprise a bimetallic structure to convert thermal fluctuations into mechanical displacement. The vibrational lens is suitable for use in a vibrational and or thermal energy harvesting system. Advantageously, the vibrational lens improves the energy efficiency of, for example, an internal combustion engine whilst mitigating the need for vibrational damping mechanisms and or thermal insulation.

Throughout the specification, unless the context demands otherwise, the terms "comprise" or "include", or variations such as "comprises" or "comprising", "includes" or "including" will be understood to imply the inclusion of a stated integer or group of integers, but not the exclusion of any other integer or group of integers. Furthermore, unless the context clearly demands otherwise, the term "or" will be interpreted as being inclusive not exclusive.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A vibrational lens comprising:
  at least two focusing members, each of the at least two focusing members having a proximal end for attachment to a vibrational source and a distal end;
  wherein the at least two focusing members are arranged such that the separation between the focusing members decreases from the proximal ends towards the distal ends, to focus vibrations from the vibrational source to an energy conversion means at the distal ends; and
  wherein the at least two focusing members are arranged such that an open space is maintained between the distal ends, the open space being configured for placement of at least a portion of the energy conversion device therein.

2. The vibrational lens as claimed in claim 1, wherein the at least two focusing members each comprise a first portion located between the proximal end and distal end and the first portions of the at least two focusing members are angled relative to each other such that the at least two focusing members converge at the distal ends.

3. The vibrational lens as claimed in claim 2, wherein the at least two focusing members each comprise a second portion located at the proximal end and the second portions of the at least two focusing members are arranged in substantially the same orientation.

4. The vibrational lens as claimed in claim 3, wherein the vibrational lens further comprises a backplate.

5. The vibrational lens as claimed in claim 4, wherein the second portions of the at least two focusing members are fixed to the backplate.

6. The vibrational lens as claimed in claim 3, wherein the at least two focusing members each comprise a third portion located at the distal end and the third portions of the at least two focusing members are substantially parallel.

7. The vibrational lens as claimed in claim 6, wherein the third portions of the at least two focusing members define a focal point of the vibrational lens.

8. The vibrational lens as claimed in claim 1, wherein the at least two focusing members comprise brass.

9. The vibrational lens as claimed in claim 1, wherein the at least two focusing members comprise a first layer and a second layer and the first layer is fixed to the second layer.

10. The vibrational lens as claimed in claim 9, wherein the first layer has a different coefficient of thermal expansion to the second layer.

11. The vibrational lens as claimed in claim 9, wherein the first layer comprises brass and the second layer comprises steel.

12. The vibrational lens as claimed in claim 1, wherein the vibrational lens further comprises one or more springs and the one or more springs connect the at least two focusing members.

13. The vibrational lens as claimed in claim 1, wherein the vibrational lens further comprises one or more weights attached to one or more of the at least two focusing members.

14. The vibrational lens as claimed in claim 1, wherein the vibrational lens further comprises a dynamic control system.

15. The vibrational lens as claimed in claim 1, wherein the vibrational lens comprising three focusing members.

16. The vibrational lens as claimed in claim 1, wherein the focusing members are focusing plates and or focusing rods.

17. An energy harvesting system comprising:
a vibrational source;
an energy conversion means; and
a vibrational lens comprising:
at least two focusing members, each of the at least two focusing members having a proximal end for attachment to the vibrational source and a distal end;
wherein the at least two focusing members are arranged such that the separation between the focusing members decreases from the proximal ends towards the distal ends, to focus vibrations from the vibrational source to the energy conversion means at the distal ends; and
wherein the at least two focusing members are arranged such that an open space is maintained between the distal ends, the open space being configured for placement of at least a portion of the energy conversion means therein.

18. The energy harvesting system as claimed in claim 17, wherein the proximal end of the vibrational lens is fixed to the vibrational source.

19. The energy harvesting system as claimed in claim 17, wherein the vibrational source is an internal combustion engine.

20. The energy harvesting system as claimed in claim 17, wherein the energy conversion means is one or more piezoelectric crystals.

21. The energy harvesting system as claimed in claim 17, wherein the energy conversion means is one or more magnets and one or more coils.

22. The energy harvesting system as claim 17, wherein the energy harvesting system further comprises one or more bimetallic strips.

23. The energy harvesting system as claimed in claim 17, wherein the energy harvesting system further comprises one or more vibration chambers.

24. The energy harvesting system as claimed in claim 23, wherein the vibration chamber comprises a first surface and a second surface and the vibration chamber is dimensioned relative to the distal end of the bimetallic strip such that the bimetallic strip can strike the first and second surfaces of the vibration chamber.

25. A method of manufacturing a vibrational lens comprising:
providing at least two focusing members, each having a proximal end for attachment to a vibrational source and a distal end; and
arranging the at least two focusing members such that the separation between the at least two focusing members decreases from the proximal ends towards the distal ends, to focus vibrations from the vibrational source to an energy conversion means at the distal ends, wherein the at least two focusing members are arranged such that an open space is maintained between the distal ends, the open space being configured for placement of at least a portion of the energy conversion means therein.

26. The method of manufacturing a vibrational lens as claimed in claim 25, wherein the method further comprises determining the characteristics of the vibrational source.

27. The method of manufacturing a vibrational lens as claimed in claim 26, wherein determining the characteristics of the vibrational source comprises quantifying any one of the following parameters: revolutions per minute, noise level, engine gas temperature, output power, torque and ambient temperature.

28. The method of manufacturing a vibrational lens as claimed in claim 25, wherein the method further comprises determining the optimum parameters of the vibrational lens for use with the vibrational source.

29. The method of manufacturing a vibrational lens as claimed in claim 28, wherein determining the optimum parameters of a vibrational lens comprises determining an optimum length, width and or depth of the at least two focusing members; and or the optimum separation of the proximal ends of the at least two focusing members; and or the optimum separation of the distal ends of the at least two focusing members; and or the optimum distance for the at least two focusing members to converge; and or the optimum material or materials for the at least two focusing members; and or the optimum coefficient of thermal expansion of the material or materials of the at least two focusing members.

30. The method of manufacturing a vibrational lens as claimed in claim 29, wherein determining the optimum length of the at least two focusing members comprises attaching brass rods of different lengths to the vibrational source to determine the resonant frequency across the operational range of the vibrational source.

31. The method of manufacturing a vibrational lens as claimed in claim 25, wherein the method may further comprise determining the characteristics of a cyclic temperature variation.

32. The method of manufacturing a vibrational lens as claimed in claim 25, wherein determining the optimum parameters may also include: determining the depth of a first layer and a second layer of the at least two focusing plates; the material of the first layer; and the material of the second layer.

33. The method of manufacturing a vibrational lens as claimed in claim 32, wherein the first layer has a different coefficient of thermal expansion to the second layer.

* * * * *